(12) United States Patent
Eriguchi et al.

(10) Patent No.: US 10,935,510 B2
(45) Date of Patent: Mar. 2, 2021

(54) METHOD OF MEASURING CARBON CONCENTRATION OF SILICON SAMPLE, METHOD OF MANUFACTURING SILICON SINGLE CRYSTAL INGOT, SILICON SINGLE CRYSTAL INGOT AND SILICON WAFER

(71) Applicant: SUMCO CORPORATION, Tokyo (JP)

(72) Inventors: Kazutaka Eriguchi, Berkeley, CA (US); Shuichi Samata, Saga (JP); Noritomo Mitsugi, Saga (JP); Ayumi Masada, Saga (JP)

(73) Assignee: SUMCO CORPORATION, Tokyo (JP)

(*) Notice: Subject to any disclaimer, the term of this patent is extended or adjusted under 35 U.S.C. 154(b) by 116 days.

(21) Appl. No.: 16/092,364

(22) PCT Filed: Jan. 18, 2017

(86) PCT No.: PCT/JP2017/001443
§ 371 (c)(1),
(2) Date: Oct. 9, 2018

(87) PCT Pub. No.: WO2017/179254
PCT Pub. Date: Oct. 19, 2017

(65) Prior Publication Data
US 2019/0064098 A1    Feb. 28, 2019

(30) Foreign Application Priority Data
Apr. 11, 2016    (JP) .............................. JP2016-078579

(51) Int. Cl.
*C30B 15/10* (2006.01)
*G01N 27/24* (2006.01)
(Continued)

(52) U.S. Cl.
CPC ............. *G01N 27/24* (2013.01); *C30B 15/20* (2013.01); *C30B 29/06* (2013.01)

(58) Field of Classification Search
CPC .......... C30B 15/02; C30B 15/10; C30B 15/04
See application file for complete search history.

(56) References Cited

U.S. PATENT DOCUMENTS

| 9,541,452 B2 | 1/2017 | Nakagawa et al. |
| 2015/0338276 A1 | 11/2015 | Nakagawa et al. |
| 2018/0179661 A1 | 6/2018 | Mitsugi et al. |

FOREIGN PATENT DOCUMENTS

| JP | 2003-045928 A | 2/2003 |
| JP | 2013-152977 A | 8/2013 |

(Continued)

OTHER PUBLICATIONS

Office Action issued in Taiwan family member Patent Appl. No. 106104368, dated Jul. 13, 2018.
(Continued)

*Primary Examiner* — Robert M Kunemund
(74) *Attorney, Agent, or Firm* — Greenblum & Bernstein, P.L.C.

(57) ABSTRACT

Provided is a method of measuring a carbon concentration of a silicon sample, the method including introducing hydrogen atoms into a measurement-target silicon sample; subjecting the measurement-target silicon sample into which hydrogen atoms have been introduced to evaluation by an evaluation method of evaluating a trap level in a silicon band gap, without an electron beam irradiation treatment; and determining the carbon concentration of the measurement-target silicon sample on the basis of an evaluation result at least one trap level selected from the group consisting of Ec-0.10 eV, Ec-0.13 eV and Ec-0.15 eV, among the evaluation results obtained by the evaluation, wherein the determined carbon concentration is lower than $1.0E+16$ atoms/cm$^3$.

15 Claims, 6 Drawing Sheets

(51) Int. Cl.
C30B 29/06 (2006.01)
C30B 15/20 (2006.01)

(56) References Cited

FOREIGN PATENT DOCUMENTS

| | | |
|---|---|---|
| JP | 2015-101529 A | 6/2015 |
| JP | 2015-111615 A | 6/2015 |
| JP | 2015-222801 A | 12/2015 |
| JP | 2016-108159 A | 6/2016 |
| KR | 10-2015-0007962 A | 1/2015 |

OTHER PUBLICATIONS

International Search Report issued in International Bureau of WIPO Patent Application No. PCT/JP2017/001443, dated Apr. 11, 2017, along with an English translation thereof.
International Preliminary Report on Patentability issued in International Bureau of WIPO Patent Application No. PCT/JP2017/001443, dated Oct. 16, 2018.
Office Action issued in Japanese family member Patent Appl. No. 2016-078579, dated Feb. 5, 2019, along with an English translation thereof.
Office Action for KR App. No. 10-2018-7029989 dated Feb. 26, 2020 (w/ translation).

METHOD OF MEASURING CARBON CONCENTRATION OF SILICON SAMPLE, METHOD OF MANUFACTURING SILICON SINGLE CRYSTAL INGOT, SILICON SINGLE CRYSTAL INGOT AND SILICON WAFER

CROSS-REFERENCE TO RELATED APPLICATIONS

This application claims the benefit of priority to Japanese Patent Application No. 2016-078579 filed on Apr. 11, 2016, which is expressly incorporated herein by reference in its entirety.

TECHNICAL FIELD

The present invention relates to a method of measuring carbon concentration of a silicon sample, a method of manufacturing a silicon single crystal ingot, a silicon single crystal ingot, and a silicon wafer.

BACKGROUND ART

The reduction of impurity contamination that deteriorates a device property is always required for silicon wafers used as semiconductor substrates. In recent years, carbon has attracted attention as impurities contained in a silicon wafer, and the reduction of carbon contamination in a silicon wafer has been studied. In order to reduce carbon contamination, it is desirable to measure a carbon concentration of a silicon sample and, on the basis of the measurement results, manage manufacturing conditions for a silicon single crystal ingot from which a silicon wafer is cut out, so as to reduce the carbon mixed in the manufacturing process.

Conventionally, as a method of measuring carbon concentration of a silicon sample, a method using FT-IR (Fourier Transform Infrared Spectroscopy) has been commonly used. Furthermore, methods using SIMS (Secondary Ion Mass Spectrometry), or photoluminescence or cathodoluminescence have also been proposed (for example, see Japanese Unexamined Patent Application Publication No. 2013-152977, Japanese Unexamined Patent Application Publication No. 2015-101529, and Japanese Unexamined Patent Application Publication No. 2015-222801). The contents of the above publications are expressly incorporated herein by reference in their entirety.

SUMMARY OF INVENTION

The lower detection limit of FT-IR is on an order of typically $10^{15}$ atoms/cm. Although the method using FT-IR (FT-IR method) is an effective method in a case where a carbon concentration of a silicon sample is relatively high, the sensitivity is insufficient for accurately measuring a carbon concentration of a silicon sample having a low carbon contamination level, specifically a carbon concentration lower than 1E+16 atoms/cm$^3$, i.e. on an order of $10^{15}$ atoms/cm$^3$ or lower. In addition, in a case of a carbon concentration equal to or lower than 1E+15 atoms/cm$^3$, the measurement itself is difficult in the FT-IR method. However, in recent years, silicon wafers with reduced carbon concentrations and low carbon contamination have been required, and thus desirably, a trace amount of carbon in a silicon sample can be quantitatively determined with sensitivity exceeding that in the FT-IR method.

In contrast, the SIMS enables analysis with higher sensitivity than the FT-IR. Therefore, the method using SIMS (SIMS method) enables measurement of a lower carbon concentration than the FT-IR method of quantitative determination of a trace amount of carbon, desirably, carbon in a silicon sample can be quantitatively determined with sensitivity at least equal to or exceeding that in the SIMS method.

On the other hand, methods using photoluminescence or cathodoluminescence (luminescence methods) described in the above publications enable analysis with sensitivity further higher than that in the SIMS method. However, in the luminescence method described in the above publication, an electron beam irradiation treatment is required for measuring the carbon concentration. This is because the carbon concentration can be determined by measuring a concentration of Ci-Cs generated by activating a substitutional carbon (Cs) into an interstitial carbon (Ci) through an electron beam irradiation treatment. However, when there is oxygen in the silicon sample, a part of the generated interstitial carbon (Ci) is paired with the interstitial oxygen (Oi) (Ci-Oi), and thus the concentration of the finally generated Ci-Cs depends on the oxygen concentration. Consequently, the carbon concentration to be quantitatively determined is affected by the oxygen concentration of the silicon sample. In addition, the electron beam irradiation also has problems that a lead time is long, a large-scale facility is required, cost increase is caused, heat treatment for protective oxide film formation and recovery processing is required in addition to the electron beam irradiation process and the number of processes is increased, thereby resulting in easily causing disturbances, and the like. Therefore, desirably, a trace amount of carbon in a silicon sample can be quantitatively determined without an electron beam irradiation treatment.

An aspect of the present invention provides for a novel means for quantitatively determining carbon in a silicon sample with sensitivity equal to or exceeding that in the SIMS method without an electron beam irradiation treatment.

While repeating studies in order to achieve the above object, the present inventors have newly found that a carbon-related level density in a band gap of the silicon that is activated by introducing hydrogen atoms into the silicon sample correlates with the carbon concentration of the silicon sample. In addition, as a result of further earnest studies, they have newly found that a trace amount of carbon can be quantitatively determined with sensitivity equal to or exceeding that in the SIMS method and without an electron beam irradiation treatment, in accordance with the following method of measuring a carbon concentration of a silicon sample according to an aspect of the present invention.

An aspect of the present invention has been completed on the basis of the above findings An aspect of the present invention relates to a method of measuring a carbon concentration of a silicon sample (hereinafter, simply described as "measurement method"), the method including:

introducing hydrogen atoms into a measurement-target silicon sample;

subjecting the measurement-target silicon sample into which hydrogen atoms have been introduced to evaluation by an evaluation method of evaluating a trap level in a silicon band gap, without an electron beam irradiation treatment; and determining the carbon concentration of the measurement-target silicon sample on the basis of an evaluation result at least one trap level selected from the group consisting of Ec (energy on a bottom of a conduction band)-0.10 eV, Ec-0.13 eV and Ec-0.15 eV, among the evaluation results obtained by the evaluation, wherein the determined carbon concentration is lower than 1.0E+16 atoms/cm³.

The "E+" represents an exponent, as well known. For example, "1.0E+16" means "1.0×10¹⁶", as well known. The same also applies to other notations using the E+.

In an embodiment, the determined carbon concentration is equal to or lower than 1.0E+15 atoms/cm³.

In an embodiment, the oxygen concentration of the measurement-target silicon sample, determined by the FT-IR method, is equal to or higher than 1.0E+17 atoms/cm³. The oxygen concentrations described below are a values determined by the FT-IR method, unless otherwise specified.

In an embodiment, the carbon concentration of the measurement-target silicon sample is determined on the basis of an evaluation result at Ec-0.15 eV.

In an embodiment, hydrogen atoms are introduced into the measurement-target silicon sample by immersion of the measurement-target silicon sample in a solution.

In an embodiment, the solution is hydrofluoric acid.

In an embodiment, the carbon concentration of the measurement-target silicon sample is determined by use of a calibration curve on the basis of the above evaluation result.

In an embodiment, the measurement method includes:

introducing hydrogen atoms into a plurality of silicon samples for creating a calibration curve in which the carbon concentrations measured by an evaluation method other than the above evaluation method are known, subjecting the plurality of silicon samples for creating a calibration curve into which hydrogen atoms have been introduced to evaluation by the same evaluation method as that for the measurement-target silicon sample, and creating the calibration curve by use of the evaluation result at the same trap level as the trap level used for determining the carbon concentration of the measurement-target silicon sample and of the above-described known carbon concentrations.

In an embodiment, the evaluation method is a DLTS method (Deep-Level Transient Spectroscopy).

In an embodiment, a width Wa of a depletion layer formed on the silicon sample for creating the calibration curve in evaluation of the silicon sample for creating the calibration curve by the DLTS method, and a width Wb of a depletion layer formed on the measurement-target silicon sample in evaluation of the measurement-target silicon sample by the DLTS method satisfy the following equation 2:

$$|Wa-Wb| \leq 2.0 \ \mu m \qquad \text{(Equation 2)}$$

A further aspect of the present invention relates to a method of manufacturing a silicon single crystal ingot, the method including:

growing a silicon single crystal ingot by the Czochralski method;

measuring a carbon concentration of a silicon sample cut out from the silicon single crystal ingot by the above measurement method;

determining a manufacturing condition for a silicon single crystal ingot on the basis of the measured carbon concentration of the silicon sample; and growing the silicon single crystal ingot by the Czochralski method under the determined manufacturing condition.

The "manufacturing condition" in the present invention and specification includes a pulling apparatus for use, a grade of raw material polysilicon, growth conditions (pulling rate, gas flow rate, and the like), and the like. In addition, cases of changing the pulling apparatus also include a case where the pulling apparatus itself is the same but a design of a member is changed in the apparatus, a case where an installation position of a member is changed, and the like. In an embodiment, the silicon sample cut out from the top of the silicon single crystal ingot grown under the determined manufacturing condition has a carbon concentration equal to or lower than 1.0E+15 atoms/cm³ as measured by the above measurement method.

In an embodiment, the silicon sample cut out from the top has an oxygen concentration equal to or higher than 1.0E+17 atoms/cm³ as determined by the FT-IR method.

In an embodiment, the silicon single crystal ingot grown under the determined manufacturing condition has a carbon concentration equal to or lower than 1.0E+15 atoms/cm³ as measured by the above measurement method of the silicon sample cut out from this silicon single crystal ingot, over the entire area from the top to the bottom.

In an embodiment, the silicon single crystal ingot grown under the determined manufacturing condition has an oxygen concentration equal to or higher than 1.0E+17 atoms/cm³ as determined by the FT-IR for the silicon sample cut out from this silicon single crystal ingot, over the entire area from the top to the bottom.

A further aspect of the present invention relates to a silicon single crystal ingot obtained by the above manufacturing method.

A further aspect of the present invention relates to a silicon wafer cut out from the silicon single crystal ingot.

According to an aspect of the present invention, a trace amount of carbon contained in the silicon sample can be quantitatively determined with sensitivity equal to or higher than that in the SIMS method, without an electron beam irradiation treatment. Furthermore, since carbon can be quantitatively determined without an electron beam irradiation treatment, the trace amount of carbon in the silicon sample can be quantitatively determined without depending on the oxygen concentration.

DESCRIPTION OF EMBODIMENTS

Figure 1:
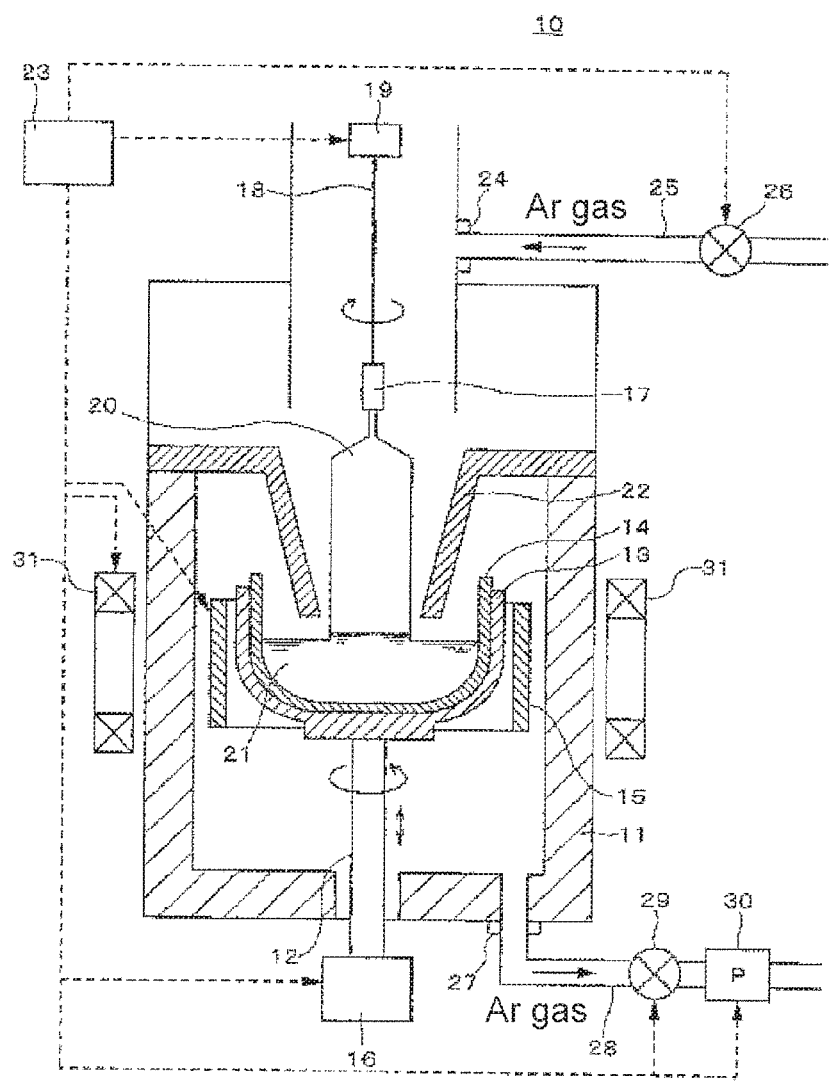
FIG. 1 is an explanatory drawing showing a configuration of a silicon single crystal pulling apparatus used in Examples.

[Method of Measuring Carbon Concentration of Silicon Sample]

A method of measuring a carbon concentration of a silicon sample according to an aspect of the present invention includes: introducing hydrogen atoms into a measurement-target silicon sample; subjecting the measurement-target silicon sample into which hydrogen atoms have been introduced to evaluation by an evaluation method of evaluating a trap level in a band gap of the silicon, without an electron beam irradiation treatment; and determining the carbon concentration of the measurement-target silicon sample on the basis of the evaluation result at least one trap level selected from the group consisting of Ec-0.10 eV, Ec-0.13 eV and Ec-0.15 eV, among the evaluation results obtained by the above evaluation. The determined carbon concentration is lower than 1.0E+16 atoms/cm$^3$.

Hereinafter, the above measurement method will be described in more detail.

<Measurement-Target Silicon Sample>

The measurement-target silicon sample in the above measurement method is, for example, a silicon sample cut out from a silicon single crystal ingot. For example, a part of the sample cut out into a wafer shape from the silicon single crystal ingot can be further cut out for measurement. In addition, the measurement-target sample can be a silicon sample cut out from various silicon wafers (for example, polished wafer, epitaxial wafer) used as semiconductor substrates. Furthermore, the silicon wafer may be a silicon wafer with various processing treatments (for example, polishing, etching, washing, and the like) ordinarily performed on silicon wafers. The silicon sample may be either an n-type silicon or a p-type silicon.

The oxygen concentration of the measurement-target silicon sample can be, for example, equal to or higher than 1.0E+17 atoms/cm$^3$ (for example, 1.0E+17 to 27.5E+17 atoms/cm$^3$). The oxygen concentration herein is a value measured by the FT-IR method.

For example, a silicon sample derived from a silicon single crystal grown by the Czochralski method (CZ method) normally contains oxygen. On the other hand, as described above, in the luminescence method requiring the electron beam irradiation treatment, the carbon concentration to be quantitatively determined depends on the oxygen concentration. For this reason, the higher the oxygen concentration of the silicon sample is, the lower the measurement accuracy for the carbon concentration tends to be.

In contrast, in the above measurement method, the electron beam irradiation treatment is not carried out in evaluation. Therefore, the carbon concentration can be measured without depending on the oxygen concentration. Accordingly, according to the above measurement method, the carbon concentration of a silicon sample having a relatively high oxygen concentration, for example, a silicon sample having an oxygen concentration within the above range can also be measured with high accuracy.

<Introduction of Hydrogen Atoms into Silicon Sample>

As described above, the present inventors have newly found a correlation between a carbon-related level density in a band gap of silicon that is activated by introduction of hydrogen atoms into a silicon sample and a carbon concentration of the silicon sample. Introduction of hydrogen atoms may be carried out by a dry treatment (dry type) or a wet treatment (wet type, namely, use of a solution). For example, introduction of hydrogen atoms by a dry treatment can be carried out by ion implantation, hydrogen plasma or the like. The introduction of hydrogen atoms in the present invention and specification also includes an embodiment in which hydrogen atoms are introduced in a state of ion or plasma.

Introduction of hydrogen atoms by wet treatment can be carried out by bringing a silicon sample into contact with a solution (for example, dipping). The solution used herein may be either an acid solution or a base solution as long as the solution contains hydrogen atoms in an ionized state (ion), a salt state, or the like. As an example, the acid solution can include hydrofluoric acid, a mixture of hydrofluoric acid and nitric acid (fluonitric acid), a mixture of sulfuric acid and hydrogen peroxide, a mixture of hydrochloric acid and hydrogen peroxide, and the like. In addition, the base solution can include a sodium hydroxide solution, a potassium hydroxide solution, a mixture of ammonia water and hydrogen peroxide, and the like. The above various solutions are preferably water-based solutions (solutions containing water), more preferably aqueous solutions. An acid concentration of the acid solution and a base concentration of the base solution are not particularly limited. As an example, introduction of hydrogen atoms with hydrofluoric acid can be carried out by immersion of a measurement-target silicon sample in 1 to 25 mass % of hydrofluoric acid for 1 to 10 minutes. After immersion, as necessary, the measurement-target sample may be subjected to aftertreatments such as washing with water and drying.

<Evaluation of Silicon Sample into which Hydrogen Atoms have been Introduced>

The carbon-related level in the band gap of the silicon activated by introduction of hydrogen atoms into a silicon sample correlates with the carbon concentration in the silicon. This point was newly found as a result of intensive studies by the present inventors. Therefore, in the silicon sample into which hydrogen atoms have been introduced, the carbon-related level density in the band gap of the silicon can be measured without an electron beam irradiation treatment. The phrase "without an electron beam irradiation treatment" in the present invention and specification means that a treatment of especially irradiating the silicon sample with an electron beam is not carried out, with the proviso that electron beam irradiation inevitably caused under sunlight, lighting or the like is acceptable.

In the above measurement method, a trap level of Ec-0.10 eV, Ec-0.13 eV or Ec-0.15 eV is used as a carbon-related level. One or more of these trap levels (carbon-related level) are activated by introduction of hydrogen atoms, and thus the carbon concentration can be measured on the basis of the trap level densities without an electron beam irradiation treatment. Measurement of the trap level density can be carried out by various evaluation methods capable of evaluating the trap level in the band gap of the silicon. Such evaluation methods can include a DLTS method, a lifetime method, an ICTS method (Isothermal Capacitance Transient Spectroscopy), a low-temperature photoluminescence (PL) method, a cathodoluminescence (CL) method, and the like. In conventional carbon concentration measurements by the PL method and the CL method, an electron beam irradiation treatment was indispensable. In contrast, according to the above-described measurement method, the one or more trap levels are activated by introduction of hydrogen atoms, and thus measurement of the carbon concentration becomes possible on the basis of the trap level densities without an electron beam irradiation treatment. Known techniques can be applied to measurement techniques by various evaluation methods, without any restriction.

For example, with respect to the DLTS method, the lower limit of trap density detection in accordance with the DLTS method is generally about $10^{-4}$ to $10^{-5}$ times the concentration of the carrier, and thus quantitative determination of carbon at a concentration of an order of $10^{13}$ atoms/cm$^3$ or lower can also be achieved. As described above, the DLTS method is a preferable evaluation method from the viewpoint of enabling quantitative determination of carbon with higher sensitivity. In a case of using the DLTS method as an evaluation method, a DLTS spectrum obtained as a sum of respective peaks obtained by the DLTS method is subjected to fitting processing by use of a known method, whereby a DLTS spectrum having a trap level at Ec-0.10 eV, Ec-0.13 eV or Ec-0.15 eV can be separated. For example, in the DLTS measurement at a frequency of 250 Hz, the trap level density at Ec-0.10 eV, the trap level density at Ec-0.13 eV, and the trap level density at Ec-0.15 eV can be measured on the basis of peak intensities (DLTS signal intensity) at peaks in the vicinity of 76 K, 87 K and 101 K, respectively. The peak used for measuring the carbon concentration is at least one of the above three peaks, or two or three peaks may be used. Normally, the higher the peak intensity is, the higher the carbon concentration can be determined to be. From the viewpoint of measuring the carbon concentration with higher accuracy, it is preferable to determine the carbon concentration of the measurement-target silicon sample on the basis of the evaluation results at Ec-0.13 eV and/or Ec-0.15 eV. For example, the higher the peak intensity of the DLTS spectrum (DLTS signal intensity) having a trap level at Ec-0.15 eV separated by the fitting processing is, the higher the carbon concentration can be determined to be.

Also in a case of using any method as the evaluation method, it is preferable to determine the carbon concentration of the measurement-target silicon sample by using a calibration curve. The calibration curve indicates the correlation between the evaluation result obtained by the evaluation method (for example, trap level density determined from the peak intensity (DLTS signal intensity) determined by the DLTS method) and the carbon concentration. The relational expression for determining the trap level density from the DLTS signal intensity is known. More preferably, hydrogen atoms are introduced into a plurality of silicon samples for creating a calibration curve having known carbon concentrations, a plurality of silicon samples for creating a calibration curve into which hydrogen atoms have been introduced is subjected to evaluation by the same evaluation method as that for the measurement-target silicon sample, and a calibration curve can be created by use of an evaluation result at the same trap level as the trap level used for determining the carbon concentration of the measurement-target silicon sample and the known carbon concentration of the silicon sample for creating the calibration curve. The known carbon concentration of the silicon sample for creating the calibration curve is measured by an evaluation method other than the evaluation method used for evaluation of the measurement-target silicon sample. The evaluation method can be exemplified by known evaluation methods such as SIMS method, FIT-IR method, luminescence method, and the SIMS method is preferable.

Various silicon samples as exemplified above for the measurement-target silicon sample can be used as the silicon sample for creating the calibration curve. From the viewpoint of further enhancing the measurement accuracy of the carbon concentration measurement, the silicon sample for creating the calibration curve is preferably either a silicon sample cut out from the same silicon sample as the measurement-target silicon sample, or a silicon sample obtained through the same manufacturing process as that for the measurement-target silicon sample.

By the way, in the DLTS method, a reverse voltage for forming a depletion layer and a weak voltage in the vicinity of 0 V for capturing carriers in the depletion layer are alternately and periodically applied to a semiconductor junction (Schottky junction or pn junction) formed on an evaluation-target silicon sample. A width (measurement depth) of the formed depletion layer varies depending on the magnitude of the reverse voltage applied herein. When the width of the depletion layer is represented by W, W can be calculated by the following equation. In the equation, $N_D$ represents the dopant concentration, and thus W is inversely proportional to the dopant concentration. Therefore, in a case where there is difference in the dopant concentration (i.e. the resistance value) between the silicon sample for creating the calibration curve and the measurement-target sample, when the reverse voltage V of the same value as that in the measurement by the DLTS method is applied, there is a change in the width W of the formed depletion layer between the silicon sample for creating the calibration curve and the measurement-target sample. From the viewpoint of measuring the carbon concentration with higher accuracy, the width Wa of the depletion layer formed in the silicon sample for creating the calibration curve is preferably substantially the same as the width Wb of the depletion layer formed in the measurement-target sample. For example, the absolute value of the difference between Wa and Wb is preferably equal to or less than 2.0 μm. That is, Wa and Wb preferably satisfy the following equation 2.

$$|Wa-Wb| \leq 2.0 \text{ μm} \quad \text{(Equation 2)}$$

In order to set widths of the depletion layers formed in both samples to the same level, a reverse voltage to be applied may be set on the basis of the dopant concentration of each sample and W calculated from the following equation.

$$W = \left\{ \frac{2K_s \varepsilon_0}{qN_D}(V_{bi} - V) \right\}^{\frac{1}{2}} \quad \text{(Equation 1)}$$

$K_s$; Relative permittivity of silicon
q; Elementary charge
$V_{bi}$; Built-in potential
$\varepsilon_0$; Permittivity of vacuum By use of the calibration curve created in this way, the carbon concentration of the measurement-target silicon sample can be determined from the evaluation result determined by the above evaluation method of the measurement-target silicon sample. The carbon concentration of the measurement-target silicon sample measured by the above measurement method is lower than 1.0E+16 atoms/cm$^3$. According to the above measurement method, a carbon concentration of a silicon sample containing carbon in a concentration range in which high-accuracy measurement is difficult in such an FT-IR method can be measured. Furthermore, according to the above measurement method, the carbon concentration within a range in which measurement is difficult in the FT-IR method can also be measured. From this point, the carbon concentration of the measurement-target sample is preferably equal to or lower than 1.0E+15 atoms/cm$^3$, as measured according to the above measurement method. Moreover, according to the above measurement method, the carbon concentration on an order of a $10^{14}$ atoms/cm$^3$ can also be measured, and furthermore carbon at a low concentration, for example, on an order of a $10^{13}$ atoms/cm$^3$ or lower can also be quantitatively measured. Therefore, the carbon concentration of the measurement-target silicon sample can be, for example, 1.0E+14 atoms/cm$^3$ to 1.0E+15 atoms/cm$^3$, or 1.0E+13 atoms/cm$^3$ to 1.0E+15 atoms/cm$^3$, as a value measured by the above-described measurement method.

[Method of Manufacturing Silicon Single Crystal Ingot, Silicon Single Crystal Ingot, and Silicon Wafer]

An aspect of the present invention relates to a method of manufacturing a silicon single crystal ingot, the method including:

growing a silicon single crystal ingot by the Czochralski method;

measuring a carbon concentration of a silicon sample cut out from the silicon single crystal ingot by the above measurement method according to an aspect of the present invention;

determining a manufacturing condition for the silicon single crystal ingot on the basis of the measured carbon concentration of the silicon sample; and growing the silicon single crystal ingot by the Czochralski method under the determined manufacturing condition.

In the method of manufacturing a silicon single crystal ingot according to an aspect of the present invention, a known technique related to the Czochralski method (CZ method) can be applied to growing the silicon single crystal ingot by the CZ method. Carbon may be mixed into the silicon single crystal ingot grown by the CZ method, due to carbon mixed into the raw material polysilicon, CO gas generated during the growth, and the like. In order to manufacture the silicon single crystal ingot in which the mixing of carbon is suppressed, it is preferable to measure a concentration of such a mixed carbon with high accuracy to thereby determine a manufacturing condition on the basis of the measurement result. For this reason, the measurement method according to an aspect of the present invention is suitable as a method of measuring the concentration of the mixed carbon.

In relation to the silicon single crystal ingot, when the upper end portion in the pulling-up direction at the time of the growth is referred to as a top and the other end portion is referred to as a bottom, the carbon concentration normally tends to become higher as closer to the bottom (segregation property). Consequently, even if the silicon sample cut out from the bottom contains carbon at a concentration allowing high-accuracy measurement by the FT-IR method, the carbon concentration of the silicon sample cut out from the top is lower than the carbon concentration of the bottom, and thus high-accuracy measurement may be difficult or the measurement itself may be difficult in the FT-IR method. However, in order to manufacture a silicon single crystal ingot in which a carbon concentration is reduced over the entire area from the top to the bottom, preferably, the carbon concentration on the top with a lower carbon concentration is measured with high accuracy, and on the basis of the measured carbon concentration, conditions for manufacturing the silicon single crystal ingot are determined so as to reduce the carbon concentration. The "top" refers to an area from the seed portion of the single crystal to the straight body part, and the "bottom" refers to an area from the straight body part of the silicon single crystal ingot to a part on which the crystal diameter is narrowed into a conical shape. In relation to the above points, the measurement method according to an aspect of the present invention is suitable as a method of quantitatively determining a trace amount of carbon in the silicon sample cut out from the top because the method allows high-accuracy measurement of the carbon concentration within a concentration range in which high-accuracy measurement is difficult in the FT-IR method. A carbon concentration of the silicon sample cut out from the top can be lower than $1.0E+16$ atoms/cm$^3$, and is preferably equal to or lower than $1.0E+15$ atoms/cm$^3$, as the carbon concentration measured by the above measurement method. In addition, a carbon concentration of the silicon sample cut out from the top can be, for example, within a range of $1.0E+14$ atoms/cm$^3$ to $1.0E+15$ atoms/cm$^3$, and also can be $1.0E+13$ atoms/cm$^3$ to $1.0E+15$ atoms/cm$^3$, as the carbon concentration measured by the above measurement method.

Furthermore, as described above, the silicon single crystal ingot grown by the CZ method normally contains oxygen. As described above, the luminescence method requires the electron beam irradiation treatment, and thus the measured carbon concentration is affected by the oxygen concentration of the silicon sample. In contrast, in the measurement method according to an aspect of the present invention described above, the carbon concentration can be measured without the electron beam irradiation treatment, and thus the carbon concentration can be measured without depending on the oxygen concentration. For this reason, according to the above measurement method, the carbon concentration of a silicon sample containing oxygen in a relatively high concentration, for example, a silicon sample containing oxygen in a concentration equal to or higher than $1.0E+17$ atoms/cm$^3$ (for example, $1.0E+17$ to $27.5E+17$ atoms/cm$^3$) can also be measured with high accuracy. Therefore, even if an oxygen concentration of a silicon sample cut out from the silicon single crystal ingot grown by the CZ method, for example, a silicon sample cut out from the bottom is within the above range, a carbon concentration can be measured with high accuracy according to the above measurement method.

The silicon sample cut out from the silicon single crystal ingot grown by the CZ method may be a sample cut out from any part (bottom, top, or intermediate area therebetween) of the silicon single crystal ingot. Preferably, the sample is a silicon sample cut out from the top which tends to contain carbon in a lower concentration. By growing the silicon single crystal ingot, as necessary, under manufacturing conditions determined by adoption of a means for reducing the carbon concentration on the basis of the carbon concentration of the silicon sample cut out from the top, manufacturing of a silicon single crystal ingot in which carbon contamination is reduced over the entire area from the top to the bottom becomes possible. As the means for reducing carbon contamination, for example, one or more of the following means can be adopted:

(1) Use of a high grade product in which a smaller amount of carbon is mixed into the raw material polysilicon (2) Proper adjustment of a pulling rate and/or an argon (Ar) gas flow rate at the time of pulling the crystal in order to suppress dissolution of CO in a polysilicon melt (3) Performing changes in a design and a mounting position of a carbon-made member included in the pulling apparatus, and the like.

The silicon single crystal ingot manufactured under the manufacturing conditions determined in such a way can have a carbon concentration equal to or lower than $1.0E+15$ atoms/cm$^3$, can also have a carbon concentration ranging from $1.0E+14$ atoms/cm$^3$ to $1.0E+15$ atoms/cm$^3$, or can also have a carbon concentration ranging from $1.0E+13$ atoms/cm$^3$ to $1.0E+15$ atoms/cm$^3$, as measured by the measurement method according to an aspect of the present invention over the entire area from the top to the bottom. In addition, the silicon single crystal ingot manufactured in such a way can also have an oxygen concentration equal to or higher than $1.0E+17$ atoms/cm$^3$ (for example, $1.0E+17$ to $27.5E+17$ atoms/cm$^3$) over the entire area from the top to the bottom.

According to a further aspect of the present invention, a silicon single crystal ingot obtained by the above manufacturing method is also provided. The silicon single crystal ingot can have a carbon concentration equal to or lower than $1.0E+15$ atoms/cm$^3$, can also have a carbon concentration ranging from $1.0E+14$ atoms/cm$^3$ to $1.0E+15$ atoms/cm$^3$, or can also have a carbon concentration ranging from $1.0E+13$ atoms/cm$^3$ to $1.0E+15$ atoms/cm$^3$, as measured by the measurement method according to an aspect of the present invention regarding the silicon sample cut out from this silicon single crystal ingot over the entire area from the top to the bottom. In addition, an oxygen concentration thereof can be, for example, equal to or higher than $1.0E+17$ atoms/cm$^3$ (for example, $1.0E+17$ to $27.5E+17$ atoms/cm$^3$) over the entire area from the top to the bottom.

According to a further aspect of the present invention, a silicon wafer cut out from the silicon single crystal ingot is also provided. Such a silicon wafer can have a carbon concentration equal to or lower than $1.0E+15$ atoms/cm$^3$, can also have a carbon concentration ranging from $1.0E+14$ atoms/cm$^3$ to $1.0E+15$ atoms/cm$^3$, or can also have a carbon concentration ranging from $1.0E+13$ atoms/cm$^3$ to $1.0E+15$ atoms/cm$^3$, as measured by the measurement method according to an aspect of the present invention. In addition, an oxygen concentration thereof can be, for example, equal to or higher than $1.0E+17$ atoms/cm$^3$ (for example, $1.0E+17$ to $27.5E+17$ atoms/cm$^3$).

As a result, according to an aspect of the present invention, provision of the silicon single crystal ingot and the silicon wafer containing carbon at a concentration difficult to measure by the FT-IR method becomes possible.

EXAMPLES

Hereinafter, the present invention will be further explained on the basis of Examples. However, the present invention is not limited to embodiments shown in Examples.

Example 1

1. Growth of Silicon Single Crystal Ingot by CZ Method

A plurality of silicon single crystal ingots having different carbon concentrations was grown by change of one or more manufacturing conditions selected from the group consisting of a grade of a raw material polysilicon, a pulling apparatus and growth conditions, by use of the silicon single crystal pulling apparatus having the configuration shown in FIG. 1.

Hereinafter, details of the silicon single crystal pulling apparatus shown in FIG. 1 will be described.

A silicon single crystal pulling apparatus 10 shown in FIG. 1 includes a chamber 11, a supporting rotary shaft 12 vertically provided penetrating through a bottom center of the chamber 11, a graphite susceptor 13 fixed to an upper end section of the supporting rotary shaft 12, a quartz crucible 14 accommodated in the graphite susceptor 13, a heater 15 provided around the graphite susceptor 13, a supporting shaft-driving mechanism 16 for lifting/lowering and rotating the supporting rotary shaft 12, a seed chuck 17 for holding seed crystals, a pulling wire 18 for hanging the seed chuck 17, a wire-winding mechanism 19 for winding the pulling wire 18, a heat-shielding member 22 for preventing heating of a silicon single crystal ingot 20 by radiant heat from the heater 15 and the quartz crucible 14 and for suppressing temperature fluctuation of a silicon melt 21, and a controller 23 for controlling each unit.

A gas inlet 24 for introducing Ar gas into the chamber 11 is provided above the chamber 11. Ar gas is introduced from the gas inlet 24 into the chamber 11 through a gas pipe 25, and a gas introduction amount is controlled by a conductance valve 26.

A gas outlet 27 for exhausting Ar gas in the chamber 11 is provided on the bottom of the chamber 11. Ar gas in the sealed chamber 11 is discharged from the gas outlet 27 to the outside via an exhaust gas pipe 28. A conductance valve 29 and a vacuum pump 30 are installed in the middle of the exhaust gas pipe 28, and by controlling a flow rate of Ar gas by the conductance valve 29 while sucking Ar gas in the chamber 11 by use of the vacuum pump 30, the depressurized state in the chamber 11 is maintained.

Furthermore, a magnetic field supplier 31 for applying a magnetic field to the silicon melt 21 is provided outside the chamber 11. The magnetic field supplied from the magnetic field supplier 31 may be a horizontal magnetic field or a cusp magnetic field.

2. Cutting-Out from Silicon Sample

Each silicon single crystal ingot grown in the above 1 was cut, and a wafer-shaped sample was cut out from the top of the ingot. A silicon sample for DLTS measurement and a silicon sample for SIMS measurement were obtained from the same sample. The oxygen concentration of each silicon sample determined by the FT-IR method was $2.0E+17$ to $12.0E\pm17$ atoms/cm$^3$. The silicon single crystal ingot was an n-type silicon (resistance value: 10 to 100 Ω·cm).

3. Measurement by DLTS Method

The silicon sample for DLTS measurement cut out from each silicon single crystal ingot was sequentially subjected to the following processes (A), (B) and (C), whereby a Schottky junction was formed on one side of each silicon sample and an ohmic layer (Ga layer) was formed on the other side. Hydrogen atoms are introduced into the silicon sample for DLTS measurement by the following process (A) (wet treatment).

(A) Immersion in 5 mass % of hydrofluoric acid for 5 minutes, and then washing with water for 10 minutes (B) Formation of a Schottky electrode (Au electrode) by vacuum deposition (C) Formation of a backside ohmic layer by gallium rubbing A reverse voltage for forming a depletion layer and a pulse voltage for capturing carriers on the depletion layer were alternately and periodically applied to the Schottky junction of the silicon sample subjected to the above processes (A) to (C). A transient response of a capacitance of a diode generated corresponding to the above voltage was measured.

The above voltage application and capacitance measurement were carried out while the sample temperature was being swept within a predetermined temperature range. The DLTS signal intensity $\Delta C$ was plotted with respect to temperature to give DLTS spectra. The measurement frequency was 250 Hz. In the measurement, the silicon sample for the DLTS measurement was not subjected to the electron beam irradiation treatment.

The obtained DLTS spectra were subjected to fitting processing (True shape fitting processing) by use of a program produced by Semilab Inc., and were separated into DLTS spectra each having a trap level at Ec-0.10 eV (peak position: temperature 76 K), a trap level at Ec-0.13 eV (peak position: temperature 87 K), and a trap level at Ec-0.15 eV (peak position: temperature 101 K). Hereinafter, the DLTS spectrum having a trap level at Ec-0.10 eV will be referred to as E1 Fit., the DLTS spectrum having a trap level at Ec-0.13 eV will be referred to as E7 Fit., and the DLTS spectrum having a trap level at Ec-0.15 eV will be referred to as E3 Fit.

Figure 2:
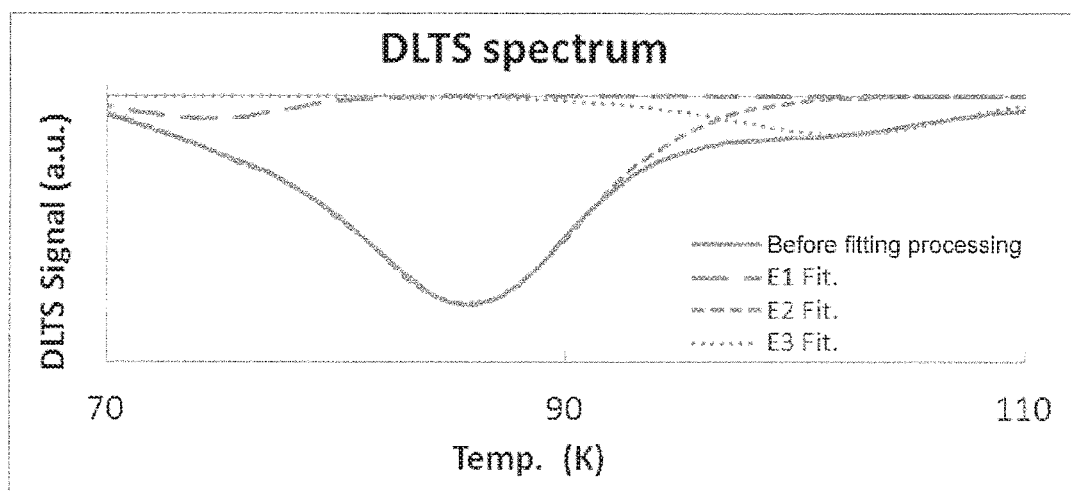
FIG. 2 illustrates an example of DLTS spectra (spectrum before fitting processing and three spectra after fitting processing) obtained in Examples.

As an example, one of the obtained DLTS spectra is shown in FIG. 2. FIG. 2 shows a DLTS spectrum before the fitting processing, and each DLTS spectrum of E1 Fit., E2 Fit. and E3 Fit. obtained by the fitting processing. In the figure, the unit of the vertical axis is an arbitrary unit (au).

3. Measurement by SIMS

A carbon concentration of the silicon sample for SIMS measurement cut out from each silicon single crystal ingot was determined by performing SIMS measurement (carbon concentration measurement by a raster changing method).

4. Creation of Calibration Curve

A calibration curve was created by use of a carbon concentration determined by the SIMS measurement in the above 3., and a trap level density determined from a DLTS signal intensity at a peak position of each DLTS spectrum (after fitting processing) determined for the silicon sample for DLTS measurement obtained from the same sample as the silicon sample for SIMS measurement. Specifically, a calibration curve shown in FIG. 3 was created, in which a trap level density determined from a DLTS signal intensity at a peak position (temperature: 76 K) in the DLTS spectrum of the E1 Fit. was plotted on the vertical axis, and a carbon concentration determined by the SIMS measurement was plotted on the horizontal axis. A calibration curve shown in FIG. 4 was created, in which a trap level density determined from a DLTS signal intensity at a peak position (temperature: 87 K) in the DLTS spectrum of the E2 Fit. was plotted on the vertical axis, and a carbon concentration determined by the SIMS measurement was plotted on the horizontal axis. A calibration curve shown in FIG. 5 was created, in which a trap level density determined from a DLTS signal intensity at a peak position (temperature: 101 K) in the DLTS spectrum of the E3 Fit. was plotted on the vertical axis, and a carbon concentration determined by the SIMS measurement was plotted on the horizontal axis.

A trap level density Nt at Ec-0.10 eV is determined from the DLTS signal intensity at the peak position (temperature: 76 K) in the DLTS spectrum of E1 Fit.

A trap level density Nt at Ec-0.13 eV is determined from the DLTS signal intensity at the peak position (temperature: 87 K) in the DLTS spectrum of E2 Fit.

A trap level density Nt at Ec-0.15 eV is determined from the DLTS signal intensity at the peak position (temperature: 101 K) in the DLTS spectrum of E3 Fit.

Figure 3:
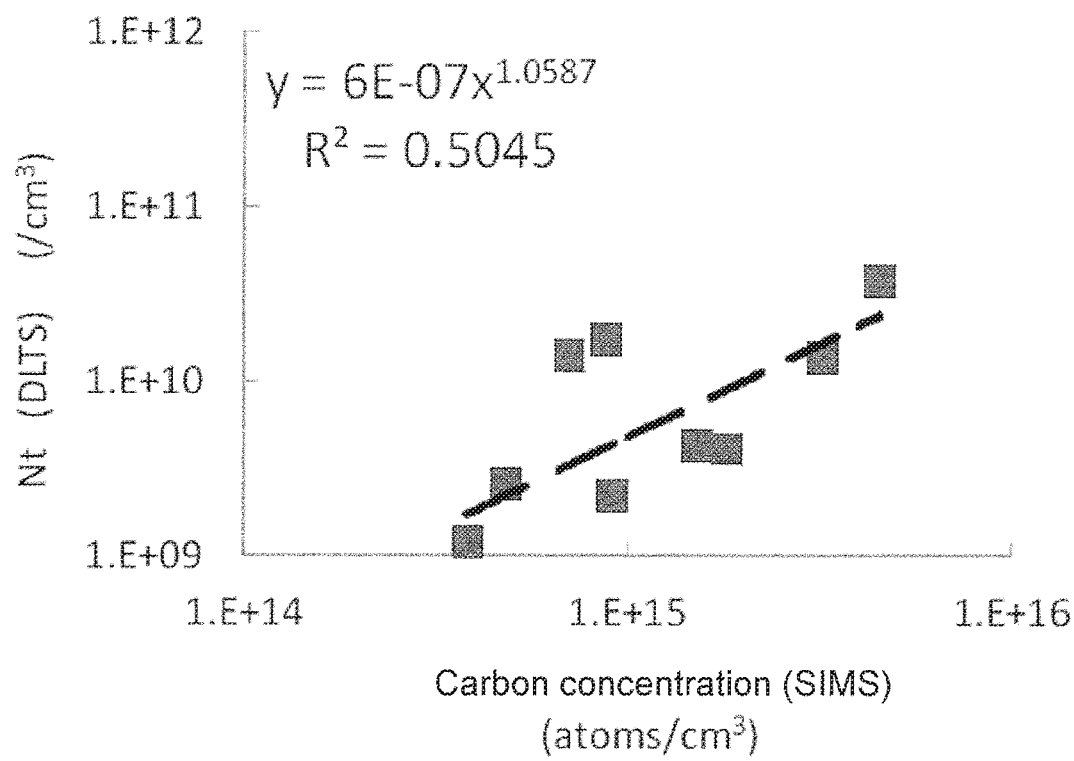
FIG. 3 illustrates a calibration curve created on the basis of an evaluation result (trap level density determined from a DLTS signal intensity) at Ec-0.10 eV in Example 1.
Figure 4:
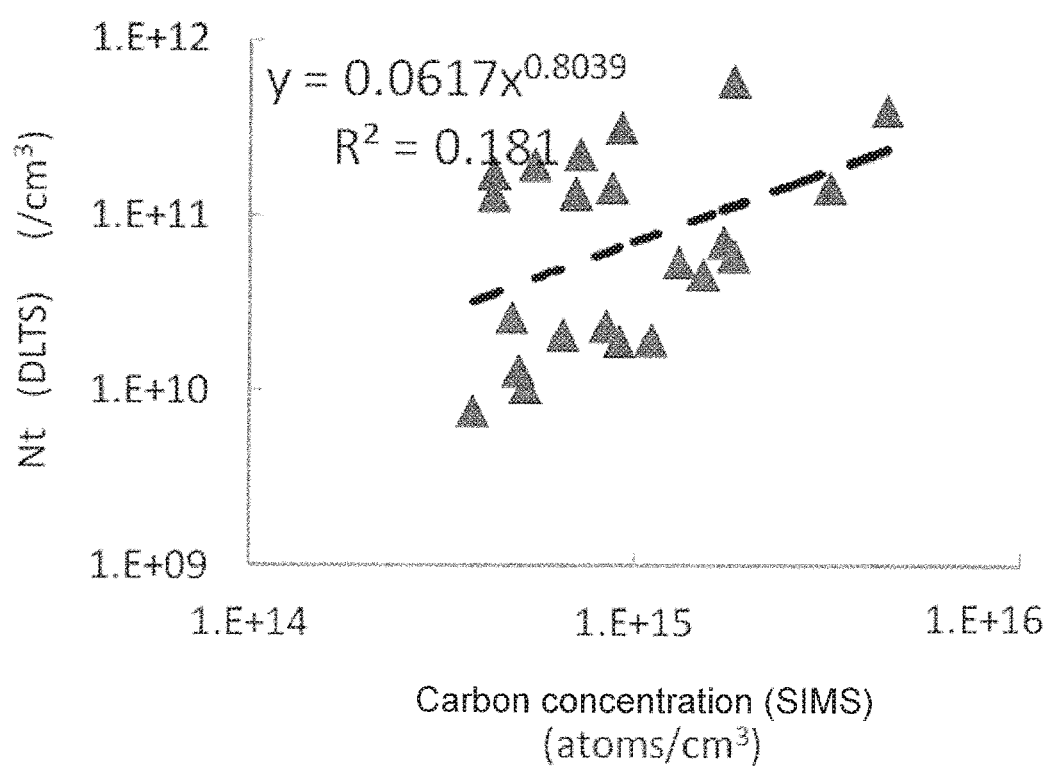
FIG. 4 illustrates a calibration curve created on the basis of an evaluation result (trap level density determined from a DLTS signal intensity) at Ec-0.13 eV in Example 1.
Figure 5:
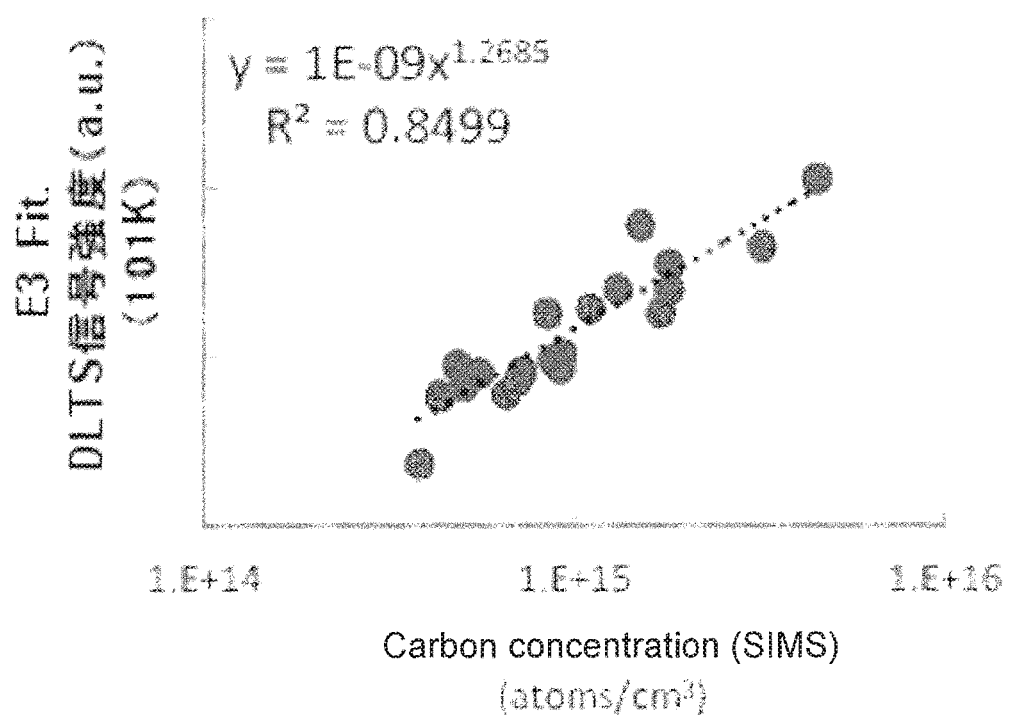
FIG. 5 illustrates a calibration curve created on the basis of an evaluation result (trap level density determined from a DLTS signal intensity) at Ec-0.15 eV in Example 1.

As shown in FIGS. 3 to 5, all of three calibration curves show positive slopes, and thus a positive correlation between the trap level density of each trap level determined from the DLTS signal intensity and the carbon concentration can be confirmed. Therefore, a carbon concentration lower than $1.0E+16$ atoms/cm$^3$ can be measured and a carbon concentration equal to or lower than $1.0E+15$ atoms/cm$^3$ which is difficult to measure by the FT-IR method can also be measured, by use of the calibration curves shown in FIGS. 3 to 5. Furthermore, a lower carbon concentration can also be measured by use of the correlation equations shown in FIGS. 3 to 5.

Among them, the calibration curve determined for the trap level at Ec-0.15 eV shown in FIG. 5 exhibited a strong correlation in which the squared correlation coefficient $R^2$ is 0.8 or higher, and thus it was also confirmed that the carbon concentration was able to be measured with higher accuracy by use of such a calibration curve.

In addition, among the respective trap levels, the DLTS spectrum having a trap level at Ec-0.13 eV is suitable for quantitative determination of a further trace amount of carbon because its peak shape is sharper.

Example 2

Figure 6:
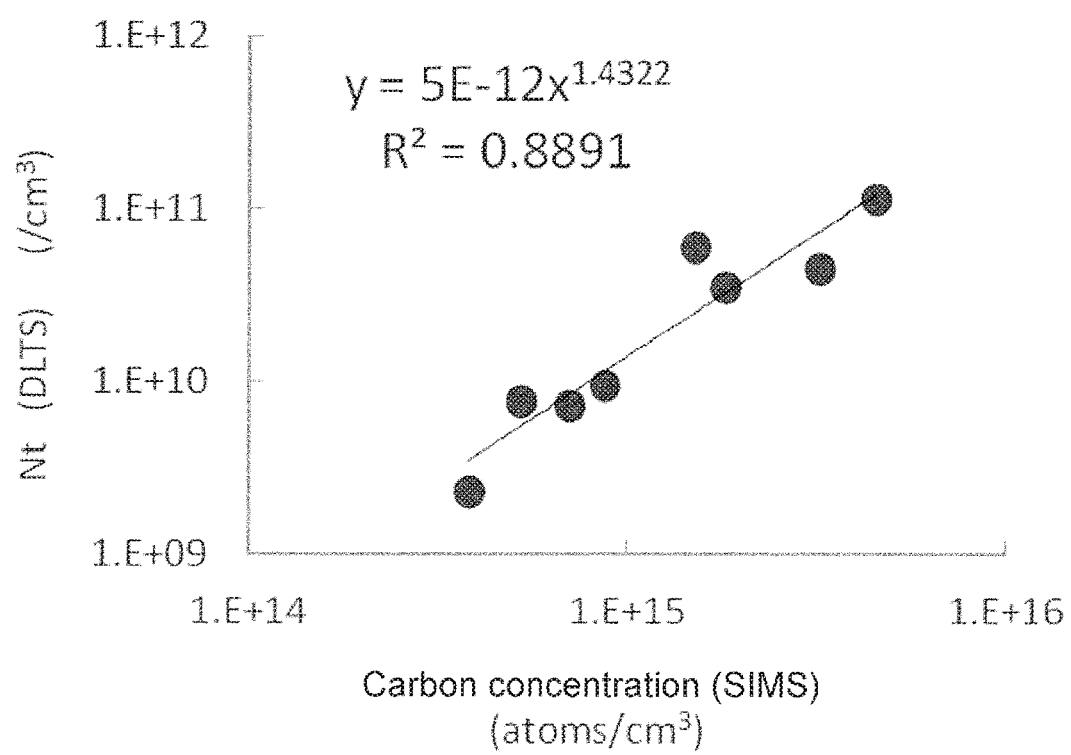
FIG. 6 illustrates a calibration curve created on the basis of a DLTS signal intensity determined while fixing a reverse voltage in Example 2.

In a similar manner to that in Example 1, DLTS measurement and SIMS measurement were carried out by use of the silicon samples cut out from the silicon single crystal ingots having different carbon concentrations. FIG. 6 shows a calibration curve created by use of the DLTS spectrum obtained by fixing the reverse voltage at −2 V, in which, in the DLTS measurement, the trap level density Nt determined from the DLTS signal intensity at the peak position (temperature: 101 K) in the DLTS spectrum of the E3 Fit. is plotted on the vertical axis, and the carbon concentration determined by the SIMS measurement is plotted on the horizontal axis.

Figure 7:
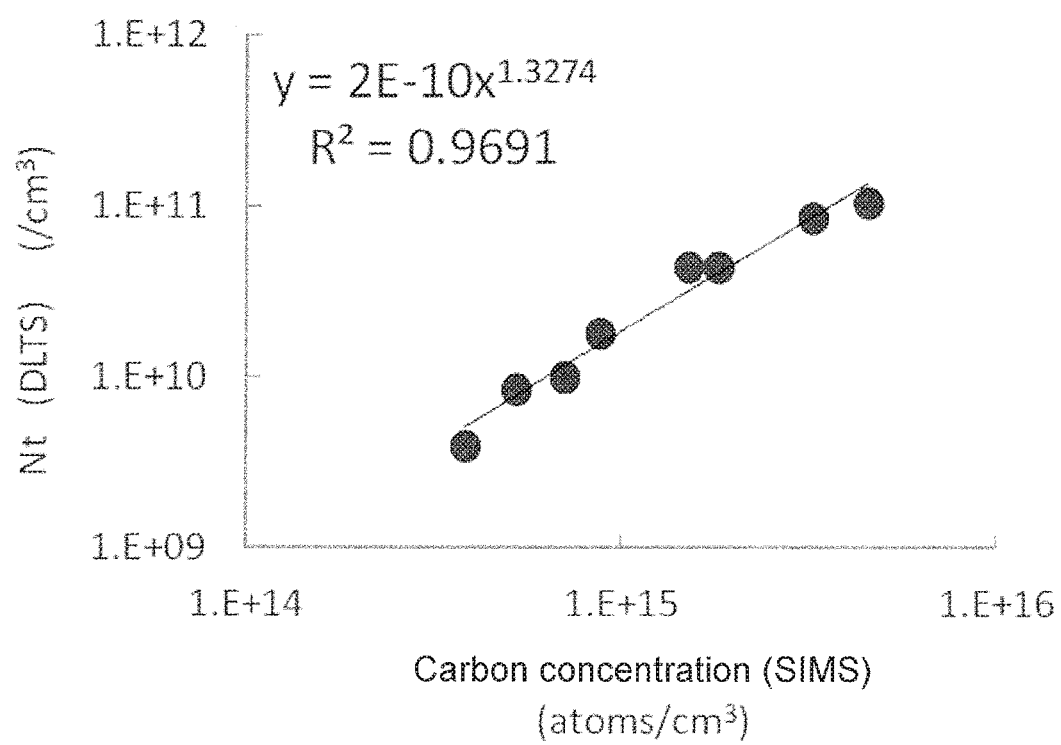
FIG. 7 illustrates a calibration curve created on the basis of a DLTS signal intensity determined while changing a reverse voltage in order to set widths of the depletion layers to the same level in Example 2.

On the other hand, the calibration curve shown in FIG. 7 is a calibration curve created by use of the DLTS spectrum obtained while changing the reverse voltage in accordance with the dopant concentration of the silicon sample by use of Equation 1 so that the width of the depletion layer (depth from the surface) is in a range of 3.0 to 4.5 μm (i.e. |Wa−Wb|≤1.5 μm) in each sample, in which the trap level density Nt determined from the DLTS signal intensity at the peak position (temperature: 101 K) in the DLTS spectrum of the E3 Fit. is plotted on the vertical axis, and the carbon concentration determined by the SIMS measurement is plotted on the horizontal axis. The reverse voltage to be applied to each silicon sample was a reverse voltage calculated by use of Equation 1 shown above so that the width W of the depletion layer was in a range of 3.0 to 4.5 μm in accordance with the dopant concentration of each silicon sample.

When making a comparison between the calibration curve shown in FIG. 6 and the calibration curve shown in FIG. 7, the squared correlation coefficient in the calibration curve shown in FIG. 7 was a value closer to 1, and thus it can be confirmed that a calibration curve allowing higher-accuracy carbon concentration measurement can be created by determining the reverse voltage to be applied so that the widths of the depletion layers are set to the same level. In order to carry out higher-accuracy measurement, it is preferable to determine the reverse voltage so that the width of the depletion layer is set to the same level as the width of the depletion layer in the DLTS measurement for creating the calibration curve, also in the DLTS measurement of the measurement-target silicon sample.

By using the calibration curve created as in Example 1 and Example 2, a trace carbon concentration can be measured with high accuracy by use of the DLTS spectrum measured without an electron beam irradiation treatment after introduction of hydrogen atoms into the measurement-target silicon sample.

Example 3

Among the silicon single crystal ingots evaluated in Example 2, the manufacturing condition of the silicon single crystal ingot having a carbon concentration exceeding $1.0E+15$ atoms/cm$^3$ determined from the calibration curve shown in FIG. 7 was changed by change of the grade of the raw material polysilicon or the like so that a mixed carbon amount is reduced, and then the silicon single crystal ingot was grown under the changed manufacturing condition. Each silicon sample was cut out from the top, the bottom, and the intermediate area therebetween of the grown ingot, and the DLTS measurement was carried out in a similar manner to that in Example 1. In the measurement, the reverse voltage was changed in accordance with the dopant concentration of the silicon sample by use of Equation 1 so that the width of the depletion layer was in a range of 3.0 to 4.5 µm. When the carbon concentrations in the silicon samples cut out from the top, the bottom, and the intermediate area therebetween of the grown ingot were determined by use of the calibration curve shown in FIG. 7 on the basis of the DLTS signal intensity at the peak position (temperature: 101 K) in the DLTS spectrum of E3 Fit., all of the carbon concentrations were equal to or lower than 1.0E+15 atoms/cm$^3$, and it was confirmed that the carbon mixing was suppressed by change of the manufacturing condition and a silicon single crystal ingot having a lower carbon concentration was obtained. The oxygen concentrations in these silicon samples measured by the FT-IR method were in a range of 2.0E+17 to 12.0E+17 atoms/cm$^3$.

Although, in the above Examples, the DLTS method was used as an evaluation method of evaluating the trap level in the silicon band gap, the carbon concentration can be measured without an electron beam irradiation treatment by use of various evaluation methods for evaluating the trap level in the silicon band gap, on the basis of the evaluation results at least one trap level selected from the group consisting of Ec-0.10 eV, Ec-0.13 eV and Ec-0.15 eV obtained for the silicon sample into which hydrogen atoms have been introduced.

INDUSTRIAL APPLICABILITY

An aspect of the present invention is useful in the technical field of silicon single crystal ingots and silicon wafers.

The invention claimed is:

1. A method of measuring a carbon concentration of a silicon sample, the method comprising:
    introducing hydrogen atoms into a measurement-target silicon sample;
    subjecting the measurement-target silicon sample to an evaluation method of evaluating a trap level in a silicon band gap, without performing an electron beam irradiation treatment; and
    determining a carbon concentration of the measurement-target silicon sample on the basis of at least one trap level selected from the group consisting of Ec-0.10 eV, Ec-0.13 eV and Ec-0.15 eV,
    wherein the method is capable of measuring a carbon concentration that 1.0E+16 atoms/cm$^3$.

2. The method of measuring a carbon concentration of a silicon sample according to claim 1,
    wherein the determined carbon concentration is equal to or lower than 1.0E+15 atoms/cm$^3$.

3. The method of measuring a carbon concentration of a silicon sample according to claim 1,
    wherein an oxygen concentration of the measurement-target silicon sample, determined by FT-IR method, is equal to or higher than 1.0E+17 atoms/cm$^3$.

4. The method of measuring a carbon concentration of a silicon sample according to claim 1,
    wherein the carbon concentration of the measurement-target silicon sample is determined on the basis of an evaluation result at Ec-0.15 eV.

5. The method of measuring a carbon concentration of a silicon sample according to claim 1,
    wherein the introduction of hydrogen atoms into the measurement-target silicon sample is conducted by immersion of the measurement-target silicon sample in a solution.

6. The method of measuring a carbon concentration of a silicon sample according to claim 5,
    wherein the solution is hydrofluoric acid.

7. The method of measuring a carbon concentration of a silicon sample according to claim 1,
    wherein the carbon concentration of the measurement-target silicon sample is determined by use of a calibration curve on the basis of the evaluation result.

8. The method of measuring a carbon concentration of a silicon sample according to claim 7, the method comprising:
    introducing hydrogen atoms into a plurality of silicon samples for creating a calibration curve in which carbon concentrations measured by an other evaluation method are known,
    subjecting the plurality of silicon samples to evaluation by the same evaluation method as for the measurement-target silicon sample, and creating the calibration curve by use of the evaluation result at the same trap level as the trap level used for determining the carbon concentration of the measurement-target silicon sample and of the known carbon concentrations.

9. The method of measuring a carbon concentration of a silicon sample according to claim 8,
    wherein the evaluation method is DLTS.

10. The method of measuring a carbon concentration of a silicon sample according to claim 9,
    wherein a width Wa of a depletion layer formed on the silicon sample for creating the calibration curve in evaluation of the silicon sample for creating the calibration curve by the DLTS method, and a width Wb of a depletion layer formed on the measurement-target silicon sample in evaluation of the measurement-target silicon sample by the DLTS method satisfy the following equation 2:

$$|Wa-Wb| \leq 2.0 \text{ µm.} \qquad \text{(Equation 2)}$$

11. A method of manufacturing a silicon single crystal ingot, the method comprising:
    growing a silicon single crystal ingot by Czochralski method;
    measuring a carbon concentration of a silicon sample cut out from the silicon single crystal ingot by the method according to claim 1;
    determining a manufacturing condition for the silicon single crystal ingot to be manufactured resulting in the carbon concentration of the silicon sample being lower than 1.0E+16 atoms/cm$^3$; and
    growing the silicon single crystal ingot by the Czochralski method under the determined manufacturing condition to achieve the carbon concentration of the silicon sample being lower than 1.0E+16 atoms/cm$^3$;
    wherein the manufacturing condition comprises at least one of a grade of the silicon sample, a pulling rate, and an argon gas flow rate.

12. The method of manufacturing a silicon single crystal ingot according to claim 11,
    wherein a silicon sample cut out from the top of the silicon single crystal ingot grown under the determined manufacturing condition has a carbon concentration equal to or lower than 1.0E+15 atoms/cm$^3$.

13. The method of manufacturing a silicon single crystal ingot according to claim 11, wherein the silicon sample cut out from the top has an oxygen concentration equal to or higher than $1.0E+17$ atoms/cm$^3$ as determined by FT-IR method.

14. The method of manufacturing a silicon single crystal ingot according to claim 11,
wherein the silicon single crystal ingot grown under the determined manufacturing condition has a carbon concentration equal to or lower than $1.0E+15$ atoms/cm$^3$ of a silicon sample cut out from the silicon single crystal ingot, over an entire area from the top to the bottom of the silicon single crystal ingot.

15. The method of manufacturing a silicon single crystal ingot according to claim 11,
wherein the silicon single crystal ingot grown under the determined manufacturing condition has an oxygen concentration equal to or higher than $1.0E+17$ atoms/cm$^3$, as determined by FT-IR method, of a silicon sample cut out from the silicon single crystal ingot, over an entire area from the top to the bottom of the silicon single crystal ingot.

* * * * *

UNITED STATES PATENT AND TRADEMARK OFFICE
CERTIFICATE OF CORRECTION

| | |
|---|---|
| PATENT NO. | : 10,935,510 B2 |
| APPLICATION NO. | : 16/092364 |
| DATED | : March 2, 2021 |
| INVENTOR(S) | : K. Eriguchi et al. |

It is certified that error appears in the above-identified patent and that said Letters Patent is hereby corrected as shown below:

In the Claims

Column 15, Line 51, Claim 1, Line 14, please insert --is lower than-- after "that"

Signed and Sealed this
Third Day of August, 2021

Drew Hirshfeld
*Performing the Functions and Duties of the
Under Secretary of Commerce for Intellectual Property and
Director of the United States Patent and Trademark Office*